United States Patent
Tseng et al.

(10) Patent No.: US 9,331,107 B2
(45) Date of Patent: May 3, 2016

(54) PIXEL STRUCTURE

(71) Applicant: Au Optronics Corporation, Hsinchu (TW)

(72) Inventors: Wei-Hao Tseng, Changhua County (TW); Fan-Wei Chang, Nantou County (TW); Shou-Wei Fang, Taipei (TW); Hong-Syu Chen, Keelung (TW); Jen-Yu Lee, Taoyuan County (TW); Tsung-Hsiang Shih, Yilan County (TW); Hung-Che Ting, Taipei (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 14/719,326

(22) Filed: May 22, 2015

(65) Prior Publication Data

US 2015/0270293 A1 Sep. 24, 2015

Related U.S. Application Data

(62) Division of application No. 14/221,262, filed on Mar. 20, 2014.

(30) Foreign Application Priority Data

Nov. 6, 2013 (TW) .............................. 102140317 A

(51) Int. Cl.
*H01L 27/12* (2006.01)
*H01L 29/66* (2006.01)
*H01L 29/423* (2006.01)
*H01L 29/417* (2006.01)

(52) U.S. Cl.
CPC ........ *H01L 27/1255* (2013.01); *H01L 27/1225* (2013.01); *H01L 27/1259* (2013.01); *H01L 29/42384* (2013.01); *H01L 29/66969* (2013.01); *H01L 29/41733* (2013.01)

(58) Field of Classification Search
None
See application file for complete search history.

(56) References Cited

U.S. PATENT DOCUMENTS

| | | | |
|---|---|---|---|
| 8,902,135 B2 | 12/2014 | Chang et al. | |
| 2007/0148831 A1* | 6/2007 | Nagata | H01L 29/41733 438/149 |
| 2012/0001167 A1* | 1/2012 | Morosawa | H01L 29/7869 257/43 |
| 2012/0132909 A1* | 5/2012 | Saito | H01L 257/43 257/43 |
| 2013/0122963 A1* | 5/2013 | Yamazaki | H01L 27/1225 455/566 |
| 2013/0126859 A1 | 5/2013 | Yeh et al. | |
| 2013/0201085 A1 | 8/2013 | Chang et al. | |
| 2014/0027882 A1 | 1/2014 | Atsumi et al. | |

FOREIGN PATENT DOCUMENTS

TW 201245830 11/2012
TW 201334178 8/2013

OTHER PUBLICATIONS

"Office Action of U.S. Co-pending Application, U.S. Appl. No. 14/221,262," issued on Jul. 9, 2015, p. 1-p. 15, in which the listed references were cited.

* cited by examiner

*Primary Examiner* — Ali Naraghi
(74) *Attorney, Agent, or Firm* — Jianq Chyun IP Office

(57) ABSTRACT

A fabrication method of a pixel structure includes the following steps. A first metal layer is patterned to form a source electrode and a drain electrode. A semiconductor material layer is patterned to form a channel layer and a pixel pattern. A first insulation layer is formed to cover the channel layer, the source electrode, the drain electrode and the pixel pattern. A gate electrode is formed on the first insulation layer located above the channel layer. A second insulation layer is formed to cover the gate electrode and the first insulation layer. A pixel opening is formed in the first insulation layer and the second insulation layer to expose a partial region of the pixel pattern. The partial region of the pixel pattern exposed by the pixel opening is modified so as to form a pixel electrode electrically connected to the drain electrode.

8 Claims, 12 Drawing Sheets

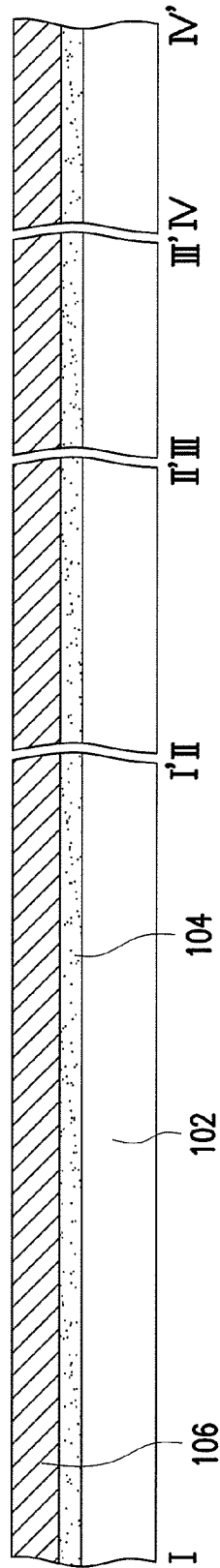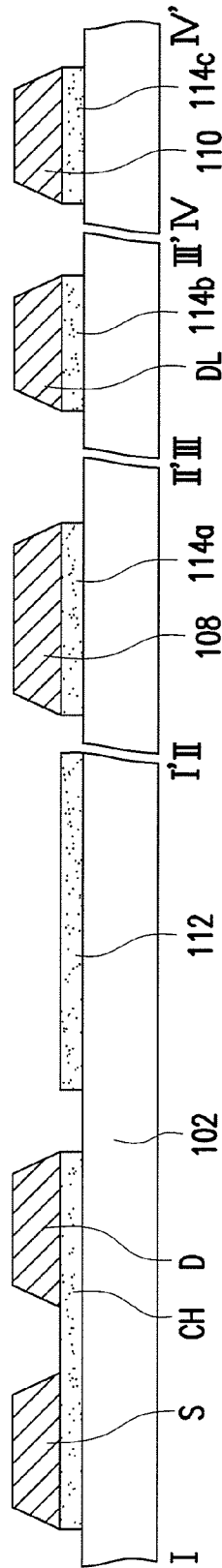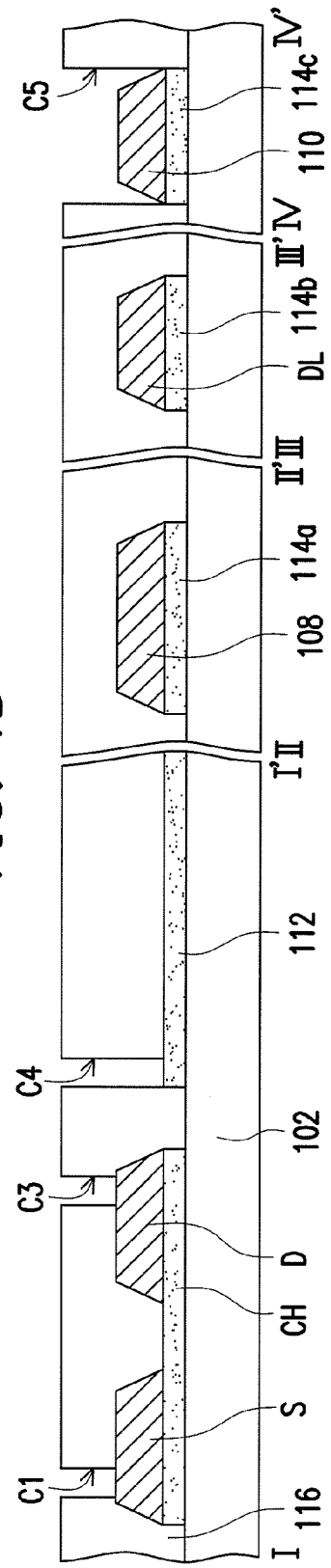

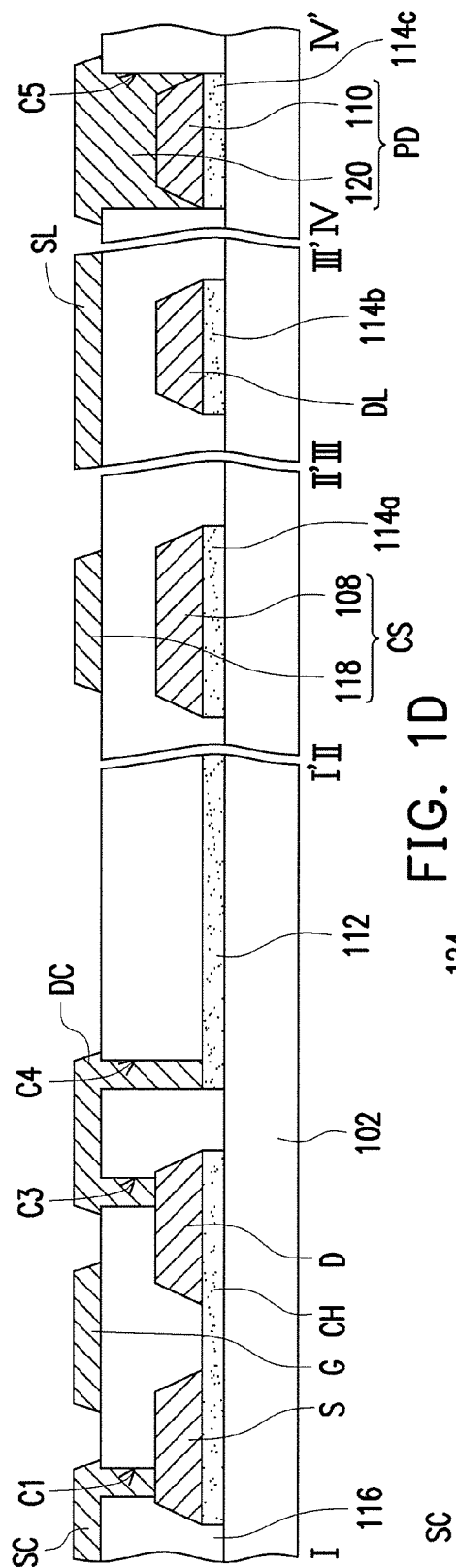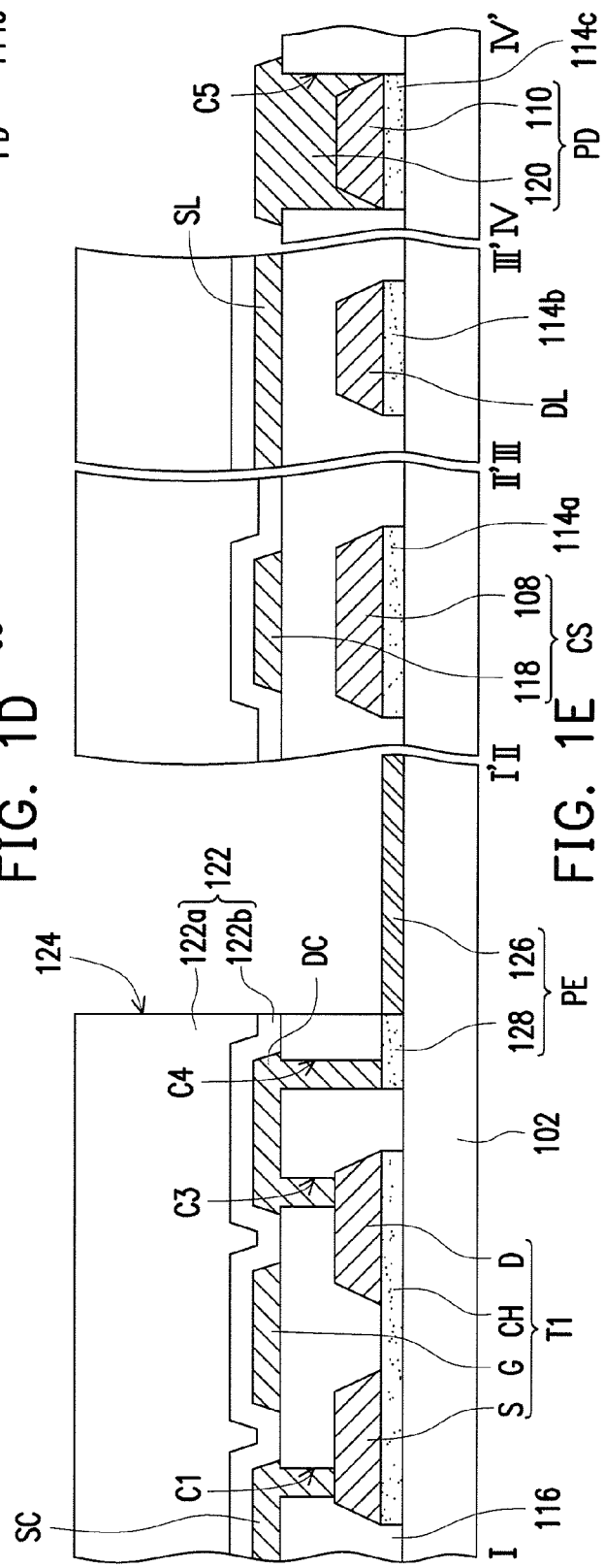

PIXEL STRUCTURE

CROSS-REFERENCE TO RELATED APPLICATION

This application is a divisional of and claims priority benefit of U.S. patent application Ser. No. 14/221,262 filed on Mar. 20, 2014, now pending, which claims the priority benefit of Taiwan application serial no. 102140317, filed on Nov. 6, 2013. The entirety of each of the above-mentioned patent applications is hereby incorporated by reference herein and made a part of this specification.

BACKGROUND OF THE INVENTION

1. Field of the Invention

The invention relates to a pixel structure and a fabrication method thereof, and more particularly, relates to a pixel structure having a modified pixel electrode and a fabrication method thereof.

2. Description of Related Art

An electroluminescent device is a self-emissive device. The electroluminescent device has many advantages, such as no viewing angle restriction, low fabrication cost, high response speed, low power consumption, a direct current driving function applicable to a portable device, a wide operating temperature range, light weight, and the ability to be miniaturized and thinner together with the hardware, and so on. As the electroluminescent device has such great potential in development, it is expected to become the next generation innovative flat display panel.

Generally speaking, the electroluminescent device is composed of an upper electrode layer, a lower electrode layer, and a light-emitting layer sandwiched between the two electrode layers. The lower electrode layer is usually made of a transparent conductive material, so the light generated by the light-emitting layer can penetrate through. The lower electrode layer is generally formed by a pixel electrode of a pixel structure. However, several photo-mask processes are normally required in order to fabricate the pixel structure, in which several insulation layers are located between the pixel electrode and a substrate. Therefore, as the light penetrates in a direction from the substrate toward the pixel electrode, it is likely causing the electroluminescent device to receive phenomena, such as insufficient illumination intensity for displaying and color shift, etc.

SUMMARY OF THE INVENTION

The invention provides a pixel structure and a fabrication method thereof, in which the fabrication method is simple and the pixel structure has ideal illumination intensity for displaying.

A fabrication method of a pixel structure of the invention includes following steps. A semiconductor material layer and a first metal layer are sequentially formed on a substrate. The first metal layer is patterned to form a source electrode and a drain electrode. The semiconductor material layer is patterned to form a channel layer and a pixel pattern, which the source electrode and the drain electrode are disposed on the channel layer. A first insulation layer is formed on the substrate, which the first insulation layer covers the channel layer, the source electrode, the drain electrode, and the pixel pattern. A gate electrode is formed on the first insulation layer located above the channel layer. A second insulation layer is formed on the substrate, and the second insulation layer covers the gate electrode and the first insulation layer. A pixel opening is formed in the first insulation layer and the second insulation layer to expose at least one partial region of the pixel pattern. The at least one partial region of the pixel pattern exposed by the pixel opening is modified to form a pixel electrode electrically connected to the drain electrode.

A fabrication method of a pixel structure of the invention includes following steps. A semiconductor material layer is formed on a substrate. The semiconductor is patterned to form a channel pattern and a pixel pattern, in which the channel pattern includes a first region and two second regions located at both sides of the first region. A first insulation layer is formed on the channel pattern, and the first insulation layer covers the first region of the channel pattern. A gate electrode is formed on the first insulation layer. A metal layer is formed to cover the second regions of the channel pattern and the gate electrode. As the metal layer is modified to form a metal oxide layer, the second regions contacted with the metal layer form a source electrode and a drain electrode which are separated from each other. The pixel pattern contacted with the metal layer forms a pixel electrode electrically connected to the drain electrode. A second insulation layer is formed on the substrate, and the second insulation layer covers the source electrode, the drain electrode, the gate electrode, and the pixel electrode. A pixel opening is formed in the second insulation layer and the metal oxide layer, which the pixel opening exposes at least one partial region of the pixel electrode.

A pixel structure of the invention is disposed on a substrate. The pixel structure includes a channel layer, a source electrode, a drain electrode, a pixel electrode, a first insulation layer, a gate electrode, and a second insulation layer. The channel layer is disposed on the substrate. The source electrode is disposed on the channel layer. The drain electrode is disposed on the channel layer, which the source electrode and the drain electrode are separated from each other. The pixel electrode is disposed on the substrate and is electrically connected to the drain electrode. The channel layer and the pixel electrode include a semiconductor material layer, in which the oxygen content of the pixel electrode is lower than the oxygen content of the channel layer. The first insulation layer covers the channel layer. The gate electrode is disposed on the first insulation layer located above the channel layer. The second insulation layer covers the gate electrode and the first insulation layer, which the second insulation layer has a pixel opening. The pixel opening exposes at least one partial region of the pixel electrode.

Based on the above, the channel layer and the pixel pattern are simultaneously formed by the fabrication method of the pixel electrode of the invention. Also, the pixel pattern is modified to form the pixel electrode having electrical conductor characteristics; and the fabrication process is simple so as to reduce the fabrication cost. Further, when the pixel electrode is used as a transparent lower electrode of the electroluminescent device, there is almost no insulation layer between the pixel electrode and the substrate, thereby ensuring sufficiency of the illumination intensity for displaying and reducing the color shift.

In order to make the aforementioned and other features and advantages of the invention more comprehensible, several embodiments accompanied with figures are described in detail below.

BRIEF DESCRIPTION OF THE DRAWINGS

FIG. 1A to FIG. 1E are schematic cross-sectional views of a fabrication process of a pixel structure of an embodiment of the invention.

DESCRIPTION OF EMBODIMENTS

Figure 1F:
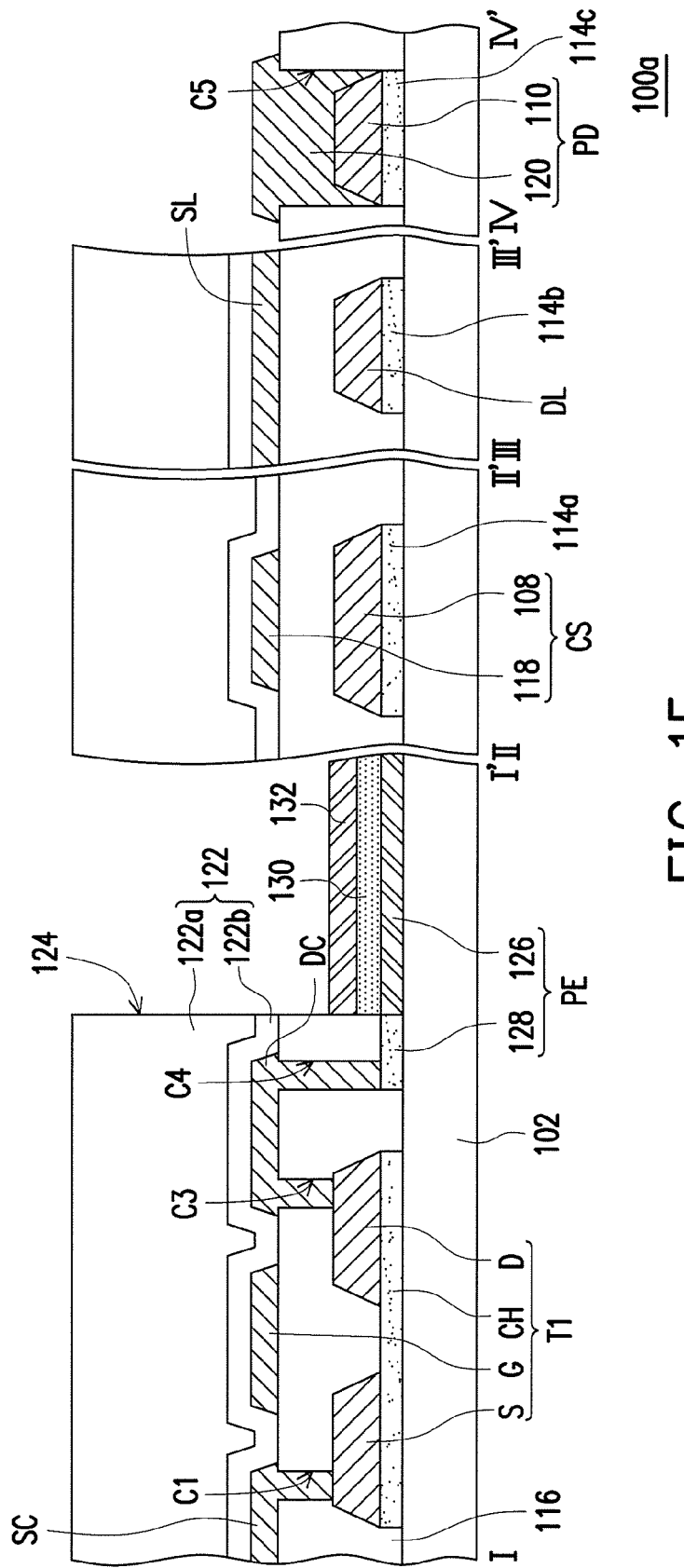
FIG. 1F is a schematic cross-sectional view of an electroluminescent device of another embodiment of the invention.
Figure 2:
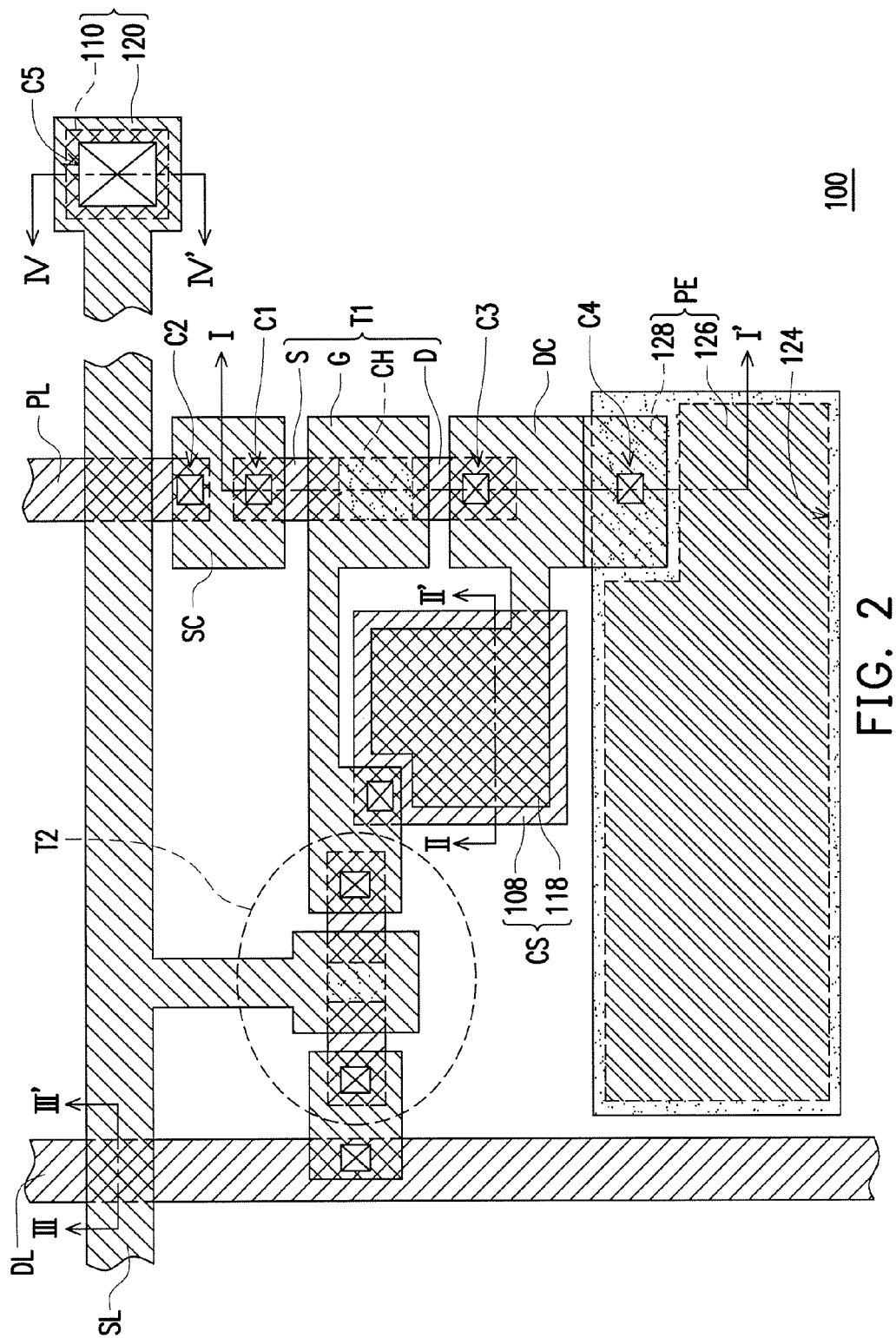
FIG. 2 is a schematic top view of the pixel structure of the embodiment of FIG. 1E.

FIG. 1A to FIG. 1E are schematic cross-sectional views of a fabrication process of a pixel structure of an embodiment of the invention. FIG. 2 is a schematic top view of the pixel structure of the embodiment of FIG. 1E, and the cutting-plane position of FIG. 1A to FIG. 1E is referring to the position of the cutting line depicted in FIG. 2. In order to clearly illustrate locations of components of the pixel structure, some of the components are omitted in FIG. 2.

Referring to FIG. 1A and FIG. 2, first, a semiconductor material layer 104 and a first metal layer 106 are formed on a substrate 102. The material of the semiconductor material layer 104 includes $In_{(2-x)}M3_{(x)}O_3[Zn_{(1-y)}M2_{(y)}O]_mN_{(z)}$, where $0 \leq x \leq 2$, $0 \leq y \leq 1$, $0 \leq m < 6$, $0 \leq z \leq 1$, and M2 and M3 each independently represents Mg, Ca, Sr, Hf, Zn, Sn, B, Al, Ga, Y, or La. The electron mobility of the semiconductor material layer 104 increases with increasing carrier concentration. The material of the first metal layer 106 includes Al, a stack film of MoN/Al, a stack film of MoN/Al/MoN, a stack film of Ti/Cu/Ti, a stack film of Ti alloy/Cu/Ti alloy, a stack film of MoN/AlNd, a stack film of Ti/AlNd, or a stack film of Ti alloy/AlNd.

Referring to FIG. 1B and FIG. 2, the semiconductor material layer 104 and the first metal layer 106 are patterned to form a source electrode S, a drain electrode D, a lower electrode 108, a data line DL, a lower conductive layer 110, a channel layer CH, a pixel pattern 112, and a plurality of pad layers 114a, 114b and 114c. The source electrode S, the drain electrode D, the lower electrode 108, the data line DL, and the lower conductive layer 110 are in the same layer. The channel layer CH, the pixel pattern 112, and the pad layers 114a, 114b and 114c are in the same layer. In detail, the semiconductor material layer 104 is patterned by undergoing a half tone mask process to form the channel layer CH, the pixel pattern 112, and the pad layers 114a, 114b and 114c. At this point, a portion of the first metal layer 106 to be patterned still remains on the channel layer CH, the pixel pattern 112, and the pad layers 114a, 114b and 114c. Then, the portion of the first metal layer 106 to be patterned again undergoes the half tone mask process to form the source electrode S, the drain electrode D, the lower electrode 108, the data line DL, and lower conductive layer 110. Namely, in the embodiment, a same photo-mask process is used to form the source electrode S, the drain electrode D, the channel layer CH, and the pixel pattern 112.

In the embodiment, the source electrode S and the drain electrode D are disposed on the channel layer CH, and the source electrode S and the drain electrode D are separated from each other. The lower electrode 108 is disposed on the pad layer 114a. The data line DL is disposed on the pad layer 114b. The lower conductive layer 110 is disposed on the pad layer 114c. Namely, the pad layer 114a is located between the substrate 102 and the lower electrode 108. The pad layer 114b is located between the substrate 102 and the data line DL. The pad layer 114c is located between the substrate 102 and the lower conductive layer 110.

Next, referring to FIG. 1C and FIG. 2, a first insulation layer 116 is formed on the substrate 102. The first insulation layer 116 covers the source electrode S, the drain electrode D, the channel layer CH, the pixel pattern 112, the lower electrode 108, and the data line DL. The first insulation layer 116 has a plurality of contact windows to expose some components, which the contact windows, for example, are formed by a photo-mask process. Specifically, a first contact window C1 exposes a partial region of the source electrode S. A second contact window C2 exposes a partial region of a power line PL. A third contact window C3 exposes a partial region of the drain electrode D. A fourth contact window C4 exposes a partial region of the pixel pattern 112. A fifth contact window C5 exposes the lower conductive layer 110. The material of the first insulation layer 116 includes titanium oxide ($TiO_x$), silicon oxide ($SiO_x$), silicon nitride ($SiN_x$), silicon oxynitride (SiON), aluminum oxide ($AlO_x$), zirconium oxide ($ZrO_x$), hafnium oxide ($HfO_x$), magnesium zirconium oxide (Mg-$ZrO_x$), barium titanium oxide ($BaTiO_x$), (x is greater than 1), or a stack layer thereof.

Next, referring to FIG. 1D and FIG. 2, a patterned metal layer is formed on the substrate 102, which a source electrode connection line SC, a gate electrode G, a drain electrode connection line DC, a upper electrode 118, a scan line SL, and a upper conductive layer 120 are formed on the first insulation layer 116 by a photo-mask process, for example. Namely, the source electrode connection line SC, the gate electrode G, the drain electrode connection line DC, the upper electrode 118, the scan line SL, and the upper conductive layer 120 are in the same layer. Specifically, the gate electrode G is disposed on the first insulation layer 116 located above the channel layer CH. The source electrode connection line SC is electrically connected to the source electrode S and the power line PL via the first contact window C1 and the second contact window C2, respectively, as shown in the schematic top view of FIG. 2. An electrical current source is provided by the power line PL to the source electrode S via the source electrode connection line SC. The drain electrode connection line DC is connected to the drain electrode D via the third contact window C3, and the drain electrode connection line DC is further connected to the pixel pattern 112 via the fourth contact window C4. The upper electrode 118 is disposed on the first insulation layer 116 located above the lower electrode 108, which the corresponding upper electrode 118 and the lower electrode 108 may form a storage capacitor CS. The upper conductive layer 120 is disposed on the lower conductive layer 110, where the upper conductive layer 120 and the lower conductive layer 110 directly contact each other to form a pad PD. The pad PD is, for example, located at an end of the data line DL or scan line SL as a conductive structure for being electrically connected to a printed circuit board or a driving chip.

Next, referring to FIG. 1E and FIG. 2, a second insulation layer 122 is formed on the substrate 102, and a pixel opening 124 is formed in the first insulation layer 116 and the second insulation layer 122 by a photo-mask process to expose a partial region of the pixel pattern 112. However, the invention should not be limited to those described herein. In the other embodiment, an opening is formed in the second insulation layer 122, and subsequently, another opening is formed in the first insulation layer 116, which the two openings together form a pixel opening 124 to expose a partial region of the pixel pattern 112. Then second insulation layer 122 covers the upper electrode 118 and the scan line SL, and the second insulation layer 122 exposes the upper conductive layer 120. Next, the partial region of the pixel pattern 112 exposed by the pixel opening 124 is modified to form a pixel electrode PE. Specifically, the second insulation layer 122 includes a first material layer 122a and a second material layer 122b. The material of the first material layer 122a includes titanium oxide ($TiO_x$), silicon oxide ($SiO_x$), silicon nitride ($SiN_x$), silicon oxynitride (SiON), aluminum oxide ($AlO_x$), zirconium oxide ($ZrO_x$), hafnium oxide ($HfO_x$), magnesium zirconium oxide ($MgZrO_x$), barium titanium oxide ($BaTiO_x$), (x is greater than 1), or a stack layer thereof. The material of the first material layer 122a may include an organic material, for example, hydrocarbons ($C_xO_yH_z$, where x, y and z are greater than 1). The material of the second material layer 122b includes titanium oxide ($TiO_x$), silicon oxide ($SiO_x$), silicon nitride ($SiN_x$), silicon oxynitride (SiON), aluminum oxide ($AlO_x$), zirconium oxide ($ZrO_x$), hafnium oxide ($HfO_x$), magnesium zirconium oxide ($MgZrO_x$), barium titanium oxide ($BaTiO_x$), (x is greater than 1), or a stack layer thereof. The material of the second material layer 122b may also include an organic material, for example, hydrocarbons ($C_xO_yH_z$, where x, y and z are greater than 1). Here, the second insulation layer 122 including two material layers is for illustration purpose; however, the invention does not pose any limitation to the number of material layers in the second insulation layer 122.

Specifically, the afore method of modifying the pixel pattern 112 is, for example, performing a nitrogen annealing process on the partial region of the pixel pattern 112 exposed by the pixel opening 124. The temperature of the nitrogen annealing process is about 150° C. to 450° C. The partial region of the pixel pattern 112 exposed by the pixel opening 124 is converted into a conductor portion 126 having conductor characteristics after performing the nitrogen annealing process. The oxygen content of the conductor portion 126 is less than 4 at % (atomic percent). A partial region of the pixel pattern 112 covered by the first insulation layer 116 and the second insulation layer 122 is unaffected by the nitrogen annealing process, which maintains the characteristics of semiconductor and then form a semiconductor portion 128. The oxygen content of the semiconductor portion 128 is equal to or greater than 4 at % (atomic percent). The conductor portion 126 and the semiconductor portion 128 constitute the pixel electrode PE. The pixel electrode PE and the channel layer CH are located on the same surface. In the embodiment, four photo-mask processes are used to complete the fabrication of the pixel structure 100, such that the fabricating process is relatively simplified, thereby reducing the fabrication cost.

In another aspect, the pixel electrode PE and the channel layer CH both include the semiconductor material layer, which the oxygen content of the conductor portion 126 of the pixel electrode PE is lower than the oxygen content of the channel layer CH. The oxygen content of the conductor portion 126 of the pixel electrode PE is less than 4 at %. The oxygen content of the channel layer CH is equal to or greater than 4 at %. The oxygen content of the semiconductor material layer affects the sheet resistance thereof. In the embodiment, the sheet resistance of the conductor portion 126 of the pixel electrode PE is roughly less than 120Ω/□. The sheet resistance of the channel layer CH is roughly greater than 1500Ω/□. Further, the pixel electrode PE includes the conductor portion 126 and the semiconductor portion 128. The conductor portion 126 has transparent electrical conductive properties; therefore the conductor portion 126 may be used as a transparent lower electrode of an electro-luminescence device. Specifically, as shown in FIG. 1F, a light-emitting layer 130 and an upper electrode layer 132 may be disposed in the pixel opening 124 so as to form a pixel structure 100a of the electro-luminescence device. In the embodiment, the pixel electrode PE is directly disposed on the substrate 102. In a conventional electro-luminescence device, several insulation layers are interposed between the lower electrode and the substrate. Hence, compared with the conventional electro-luminescence device, since the pixel electrode PE of the embodiment takes a role of the transparent lower electrode of the electro-luminescence device, stronger illumination intensity for display is maintained and a color shift phenomenon is rare to occur when the light emits from the pixel electrode PE toward the substrate 102.

In the embodiment, the source electrode S, the drain electrode D, the channel layer CH, and the gate electrode G generally constitute a first active device T1. Besides, the pixel structure 100 may further include a second active device T2 so as to form a circuit structure having two active devices and one capacitor (i.e., 2T1C). Namely, the pixel structure 100a of the electro-luminescence device of the embodiment is driven by the circuit structure having 2T1C, in which the active devices T1 and T2 are, for example, top gate electrode thin film transistors. However, the circuit structure having 2T1C is exemplified herein for illustration purposes; the invention does not pose any limitation thereto.

Figure 7:
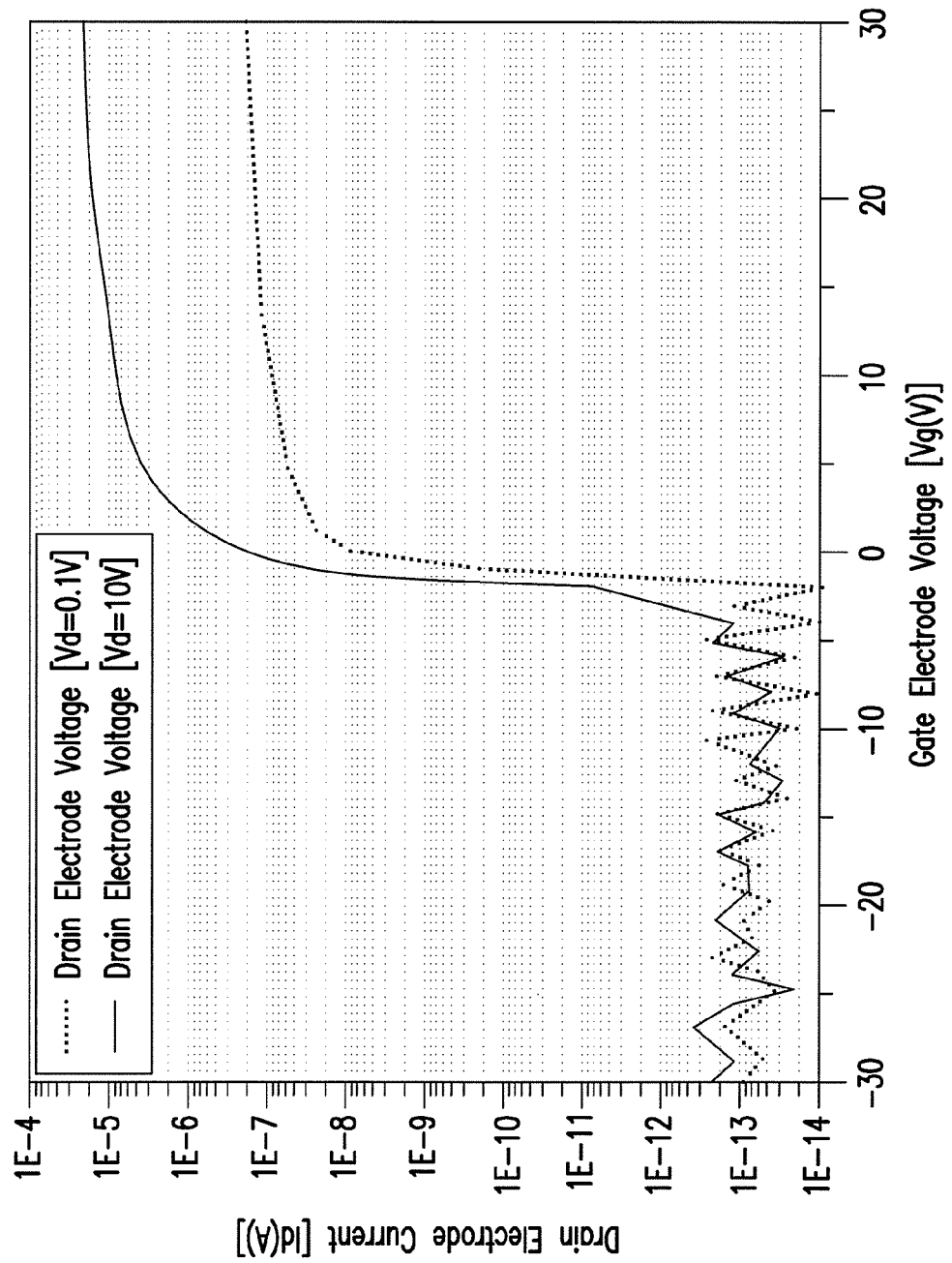
FIG. 7 is a plot of current-voltage relationships of an active device of an embodiment of the invention.

The evaluation of the first active device T1 of the pixel structure 100 of the embodiment is shown in FIG. 7. According to FIG. 7, the first active device T1 has a good electrical performance, where the carrier mobility of the first active device T1 is greater than 20 $cm^2/Vs$.

Figure 3:
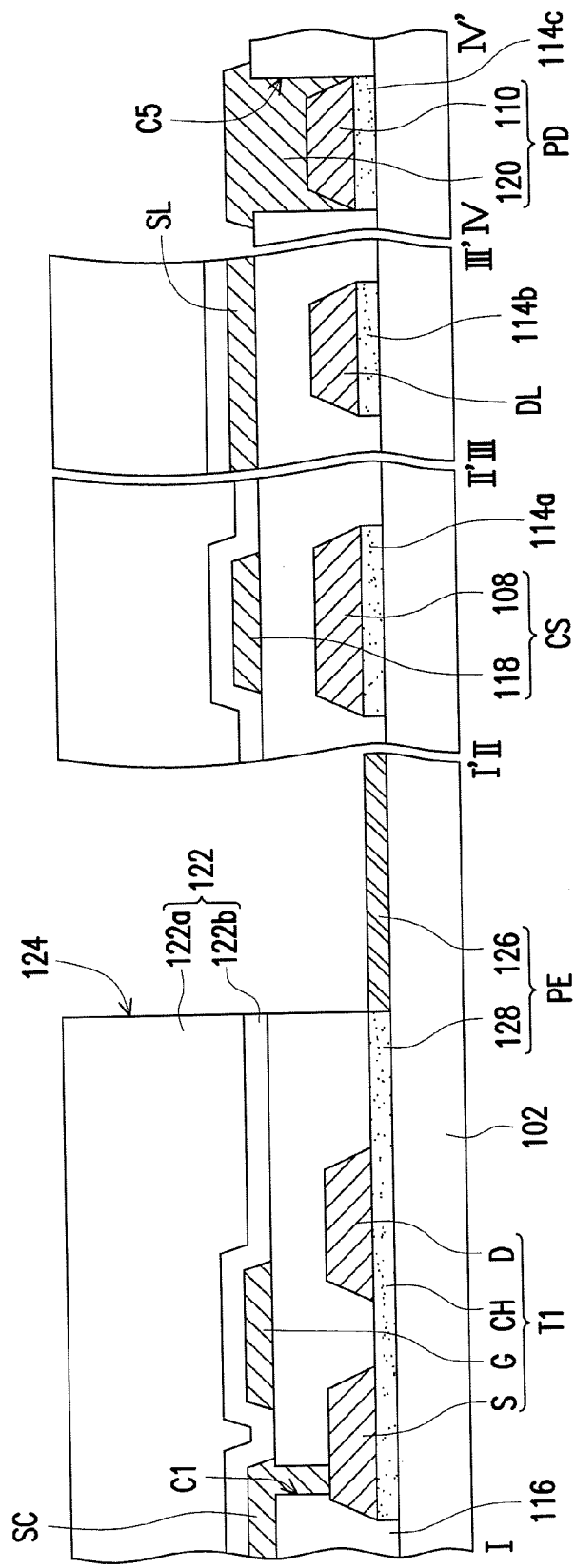
FIG. 3 is a schematic cross-sectional view of a pixel structure of another embodiment of the invention.

In the embodiment, the semiconductor portion 128 of the pixel electrode PE and the channel layer CH are separated from each other and connected to the drain electrode connection line DC. Therefore, the pixel electrode PE electrically connects to the drain electrode D via the drain electrode connection line DC, which however should not be construed as a limitation to the invention. In the embodiment of FIG. 3, the semiconductor portion 128 of the pixel electrode PE and the channel layer CH are connected with each other, thereby the pixel electrode PE is directly electrically connected to the drain electrode D via the channel layer CH.

FIG. 4A to FIG. 4F is schematic cross-sectional views of a fabrication process of a pixel structure of another embodiment of the invention. FIG. 5 is a schematic top view of the pixel structure of the embodiment of FIG. 4F, which the cutting-plane position of FIG. 4A to FIG. 4F is referring to the position of the cutting line depicted in FIG. 5. In order to clearly illustrate locations of components of the pixel structure, some of the components such as insulation layers are omitted in FIG. 5.

Figure 4A:
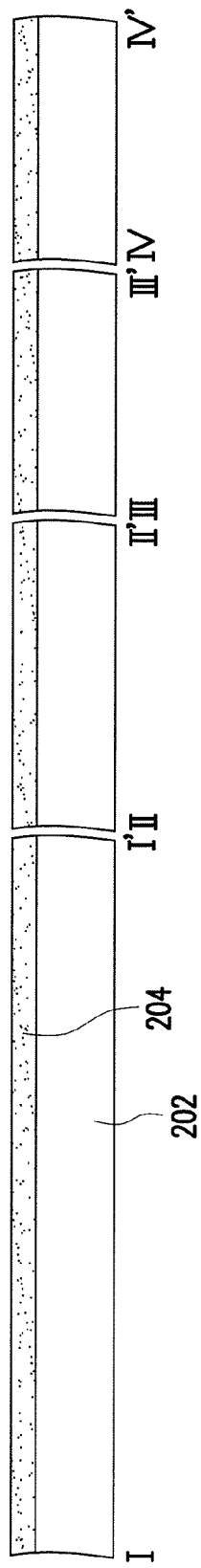
FIG. 4A to FIG. 4F is schematic cross-sectional views of a fabrication process of a pixel structure of another embodiment of the invention.
Figure 5:
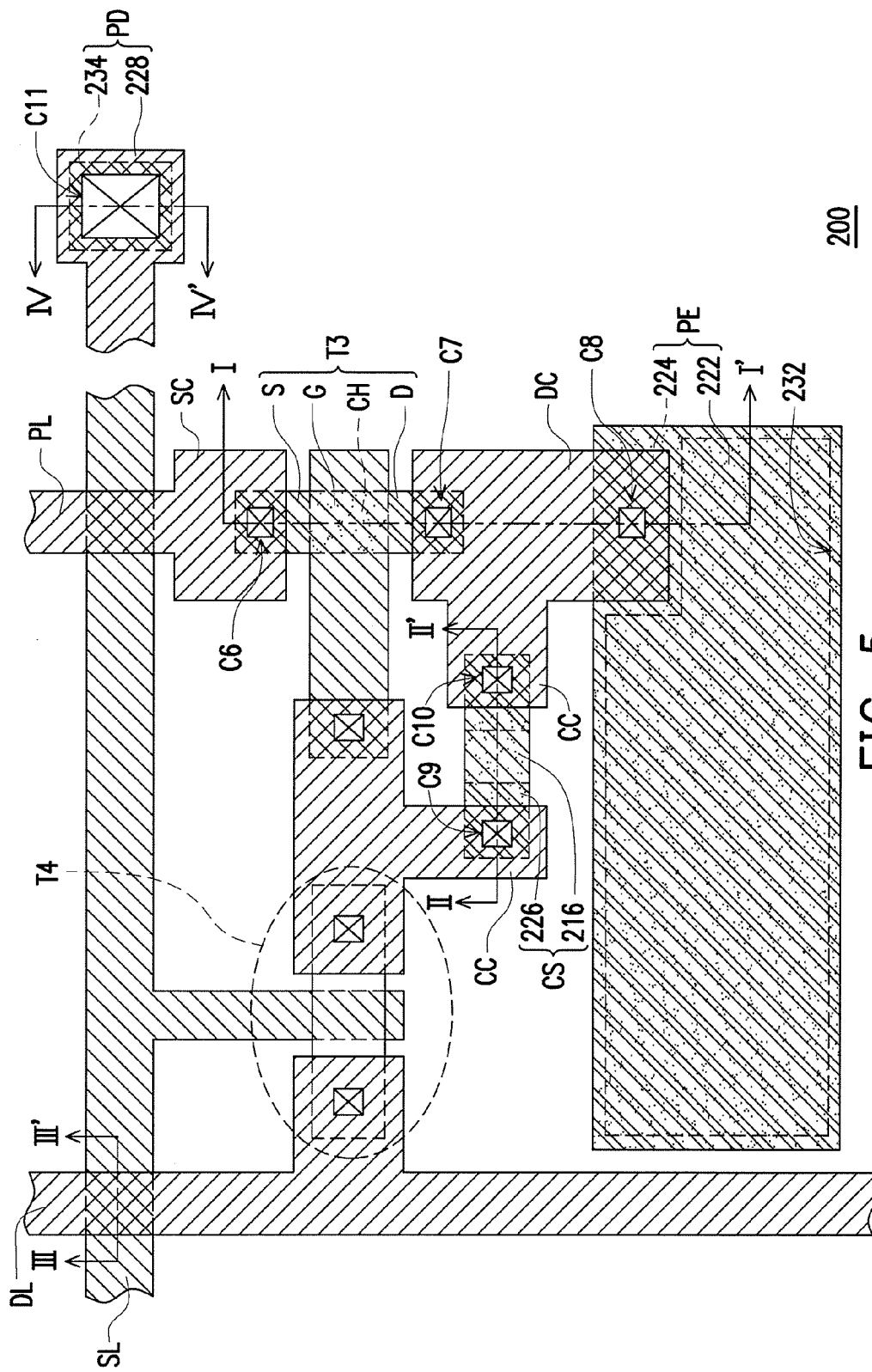
FIG. 5 is a schematic top view of the pixel structure of the embodiment of FIG. 4F.

Referring to FIG. 4A and FIG. 5, first, a semiconductor material layer 204 is formed on a substrate 202. The material of the semiconductor material layer 204 includes $In_{(2-x)}M3_{(x)}O_3[Zn_{(1-y)}M2_{(y)}O]_mN_{(z)}$, where $0 \le x \le 2$, $0 \le y \le 1$, $0 \le m < 6$, $0 \le z \le 1$, and M2 and M3 each independently represents Mg, Ca, Sr, Hf, Zn, Sn, B, Al, Ga, Y, or La.

Figure 4B:
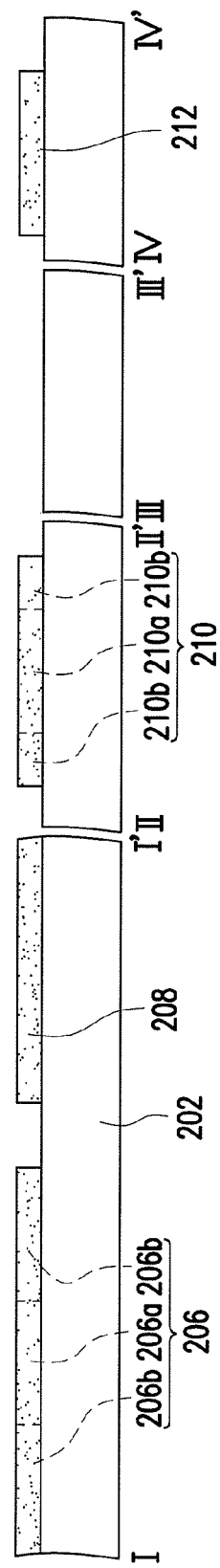

Referring to FIG. 4B and FIG. 5, the semiconductor material layer 204 is patterned to form a channel pattern 206, a pixel pattern 208, a capacitor pattern 210, and a pad pattern 212 by a photo-mask process. The channel pattern 206 includes a first region 206a and two second regions 206b, in which the second regions 206b are located at both sides of the first region 206a. The capacitor pattern 210 includes a third region 210a and two fourth regions 210b, in which the fourth regions 210b are located at both sides of the third region 210a.

Figure 4C:
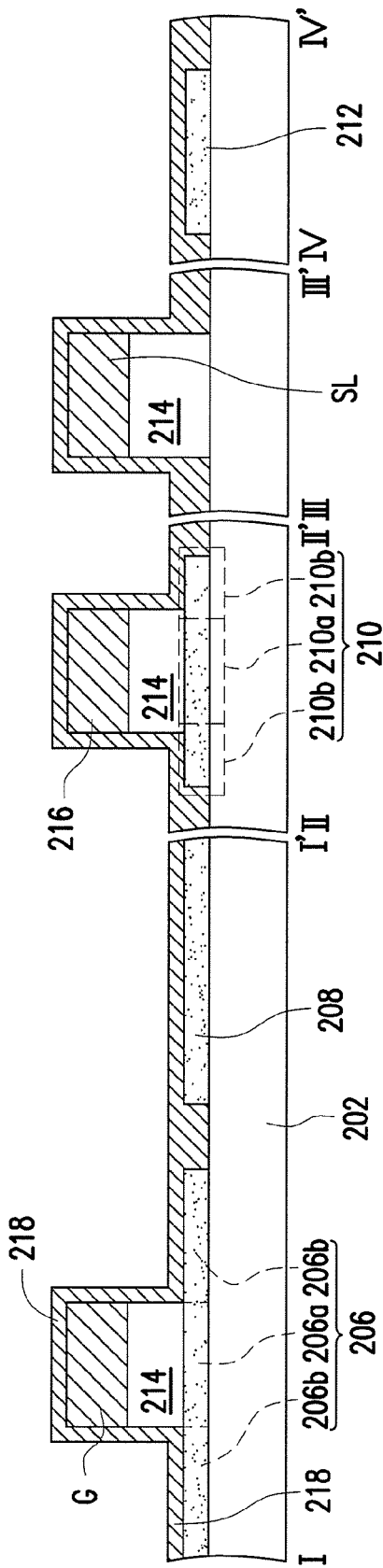

Next, referring to FIG. 4C and FIG. 5, an insulation material layer (not illustrated) and a metal material layer (not illustrated) are formed on the substrate 202. The insulation material layer and the metal material layer are patterned to form a first insulation layer 214 and a patterned metal layer by a photo-mask process. The material of the insulation material layer includes titanium oxide (TiO$_x$), silicon oxide (SiO$_x$), silicon nitride (SiN$_x$), silicon oxynitride (SiON), aluminum oxide (AlO$_x$), zirconium oxide (ZrO$_x$), hafnium oxide (HfO$_x$), magnesium zirconium oxide (MgZrO$_x$), barium titanium oxide (BaTiO$_x$), (x is greater than 1), or a stack layer thereof. The material of the insulation material layer may include an organic material, for example, hydrocarbons (C$_x$O$_y$H$_z$, where x, y and z are greater than 1). The material of the metal material layer includes Al, a stack film of MoN/Al, a stack film of MoN/Al/MoN, a stack film of Ti/Cu/Ti, a stack film of Ti alloy/Cu/Ti alloy, a stack film of MoN/AlNd, a stack film of Ti/AlNd, or a stack film of Ti alloy/AlNd. The patterned metal layer is located on the first insulation layer 214 and includes a gate electrode G, an upper electrode 216 and a scan line SL. Specifically, the first insulation layer 214 covers the first region 206a of the channel pattern 206 and the third region 210a of the capacitor pattern 210. The gate electrode G is located on the first insulation layer 214 located above the first region 206a. The upper electrode 216 is located on the first insulation layer 214 located above the third region 210a.

Next, a metal layer 218 is formed on the substrate 202. The metal layer 218 at least covers the second regions 206b of the channel pattern 206, the gate electrode G, the pixel pattern 208, the fourth regions 210b of the capacitor pattern 210, the upper electrode 216, the scan line SL, and the pad pattern 212. The material of the metal layer 218 includes Al, Ti, Si, or Mo. The thickness of the metal layer 218 is, for example, less than 150 Å.

Figure 4D:
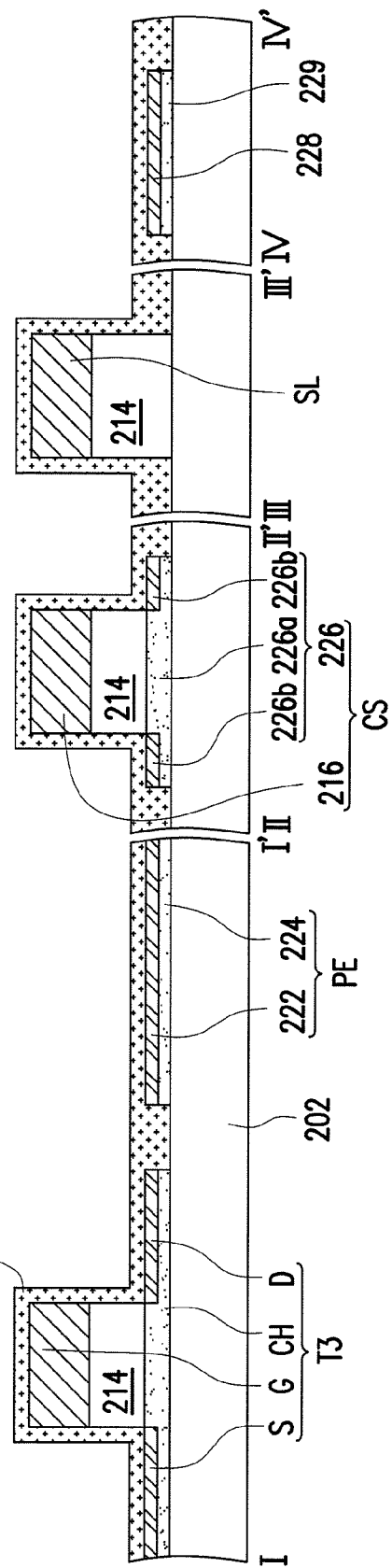

Referring to FIG. 4C, FIG. 4D and FIG. 5, the metal layer 218 is modified to form a metal oxide layer 220. In particular, the method of modifying the metal layer 218 is, for example, performing an oxygen annealing process so as to make the metal layer 218 be oxidized to form a metal oxide layer 220. The temperature of the oxygen annealing process is about 150° C. to 450° C. Here, the metal oxide layer 220 is treated as an insulation material. The regions contacted with the metal layer 218 of the channel pattern 206, the pixel pattern 208, the capacitor pattern 210 and the pad pattern 212 are affected by the temperature of the oxygen annealing process and thus the material properties thereof are changed. For instance, a semiconductor is modified into a conductor. After performing the oxygen annealing process, a source electrode S, a drain electrode D, a conductor portion 222, a semiconductor portion 224, a lower electrode 226, a lower conductive layer 228, and a pad layer 229 may be formed.

Specifically, the second regions 206b of the channel pattern 206 connected with the metal layer 218 form the source electrode S and the drain electrode D which are separated from each other. The first region 206a of the channel pattern 206 forms a channel layer CH, where the channel layer CH is located between the source electrode S and the drain electrode D. In the embodiment, the un-modified channel pattern 206 under the source electrode S and the drain electrode D is treated as a portion of the channel layer CH.

A surface portion of the pixel pattern 208 contacted with the metal layer 218 forms the conductor portion 222. The other portion of the pixel pattern 208 not contacted with the metal layer 218 forms the semiconductor portion 224. The oxygen content of the conductor portion 222 is less than 4 at %, and the oxygen content of the semiconductor portion 224 is equal to or greater than 4 at %. The conductor portion 222 and the semiconductor portion 224 constitute a pixel electrode PE. The semiconductor portion 224 is located between the conductor portion 222 and the substrate 202. In the embodiment, the pixel electrode PE and the channel layer CH are in the same layer. The pixel electrical PE and the channel layer CH are located on the same surface.

In another aspect, the pixel electrode PE and the channel layer CH both include the semiconductor material layer, which the oxygen content of the conductor portion 222 of the pixel electrode PE is lower than the oxygen content of the channel layer CH. The oxygen content of the conductor portion 222 of the pixel electrode PE is less than 4 at %. The oxygen content of the channel layer CH is equal to or greater than 4 at %. The oxygen content of the semiconductor material layer affects the sheet resistance thereof. In the embodiment, the sheet resistance of the conductor portion 222 of the pixel electrode PE is roughly less than 120Ω/□, and the sheet resistance of the channel layer CH is roughly greater than 1500Ω/□.

The fourth regions 210b of the capacitor pattern 210 contacted with the metal layer 218 form two modified portions 226b. The third region 210a of the capacitor pattern 210 forms an un-modified portion 226a. The modified portions 226b are located at both sides of the urn-modified portion 226a. The modified portions 226b, the source electrode S, and the drain electrode D are in the same layer. The first insulation layer 214 covers the un-modified portion 226a. The un-modified portion 226a and the modified portions 226b together constitute the lower electrode 226.

A surface portion of the pad pattern 212 contacted with the metal layer 218 forms the lower conductive layer 228. The lower conductive layer 228, the source electrode S, and the drain electrode D are in the same layer. The un-modified pad pattern 212 located under the lower conductive layer 228 forms the pad layer 229, which the pad layer 229 is located between the lower conductive layer 228 and the substrate 202.

Figure 4E:
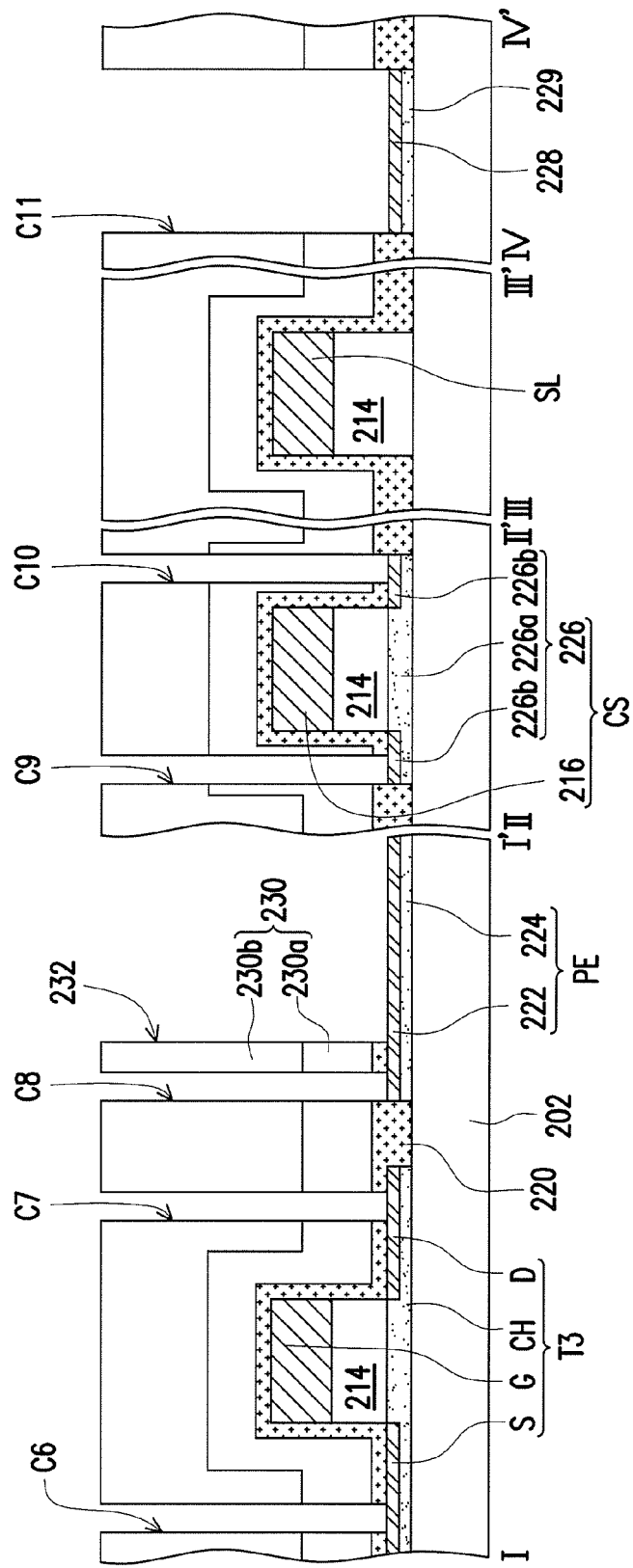

Next, referring to FIG. 4E and FIG. 5, a second insulation layer 230 is formed on the substrate 202. A pixel opening 232 is formed in the second insulation layer 230 by a photo-mask process to expose a partial region of the conductor portion 222 of the pixel electrode PE. The second insulation layer 230 covers the metal oxide layer 220. In particular, the second insulation layer 230 includes a first material layer 230a and a second material layer 230b, in which the first material layer 230a covers the metal oxide layer 220. The material of the first material layer 230a includes titanium oxide (TiO$_x$), silicon oxide (SiO$_x$), silicon nitride (SiN$_x$), silicon oxynitride (SiON), aluminum oxide (AlO$_x$), zirconium oxide (ZrO$_x$), hafnium oxide (HfO$_x$), magnesium zirconium oxide (MgZrO$_x$), barium titanium oxide (BaTiO$_x$), (x is greater than 1), or a stack layer thereof. The material of the first material layer 230a may include an organic material, for example, hydrocarbons (C$_x$O$_y$H$_z$, where x, y and z are greater than 1). The material of the second material layer 230b includes titanium oxide (TiO$_x$), silicon oxide (SiO$_x$), silicon nitride (SiN$_x$), silicon oxynitride (SiON), aluminum oxide (AlO$_x$), zirconium oxide (ZrO$_x$), hafnium oxide (HfO$_x$), magnesium zirconium oxide (MgZrO$_x$), barium titanium oxide (BaTiO$_x$), (x is greater than 1), or a stack layer thereof. The material of the second material layer 230b may also include an organic material, for example, hydrocarbons (C$_x$O$_y$H$_z$, where x, y and z are greater than 1). Here, the second insulation layer 230 including two material layers is for illustration purpose; however, the invention does not pose any limitation to the number of material layers in the second insulation layer 230.

The second insulation layer 230 and the metal oxide layer 220 further have a plurality of contact windows to expose some components. The contact windows are, for example, formed simultaneously with the pixel opening 232. Namely, when forming the contact windows, in addition to remove a portion of the second insulation layer 230, a portion of the metal oxide layer 220 is further removed to expose some components. In detail, a sixth contact window C6 exposes a partial region of the source electrode S. A seventh contact window C7 exposes a partial region of the drain electrode D. An eighth contact window C8 exposes a partial region of the pixel electrode PE. A ninth contact window C9 and a tenth contact window C10 expose the modified portion 226b of the lower electrode 226. An eleventh contact window C11 exposes the lower conductive layer 228.

Figure 4F:
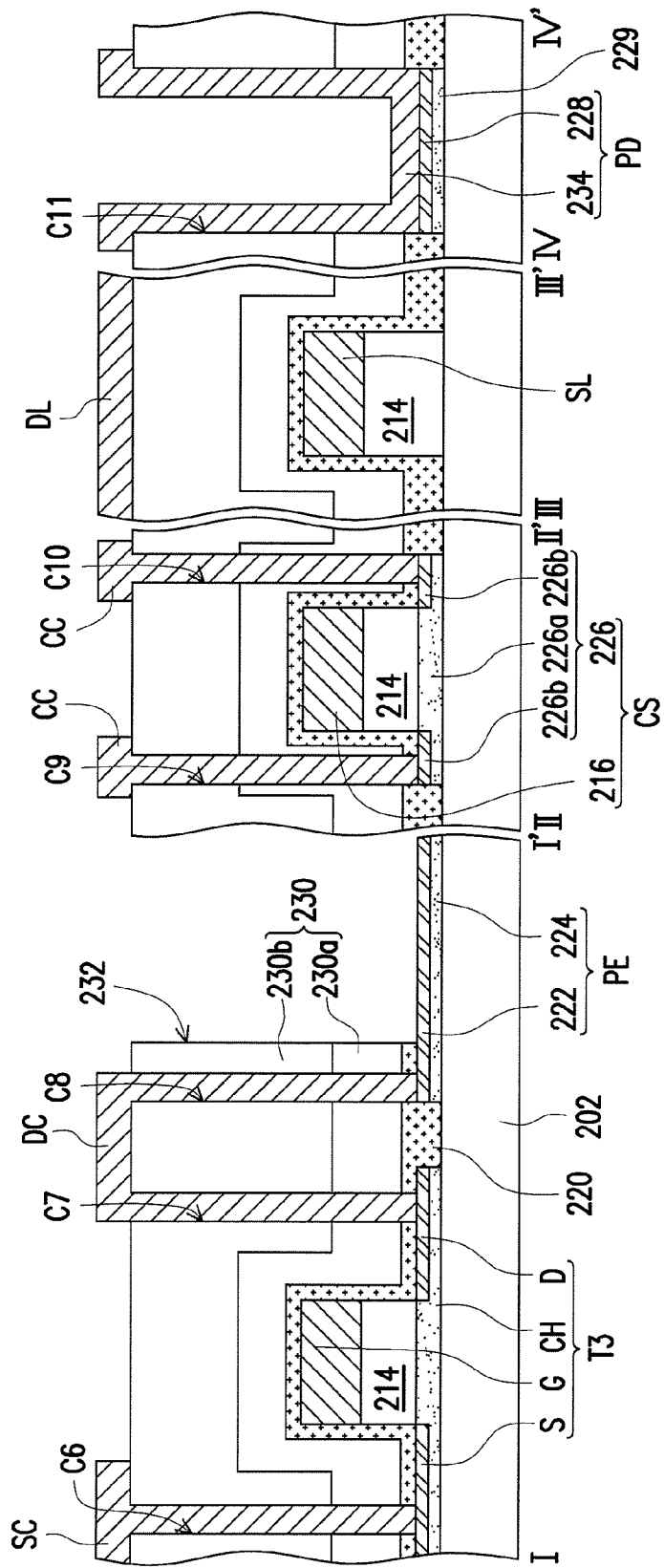

Then, referring to FIG. 4F and FIG. 5, a patterned metal layer is formed on the substrate 202, which a power line PL, a source electrode connection line SC, a drain electrode connection line DC, a capacitor connection line CC, a data line DL, and an upper conductive layer 234 are formed on the second insulation layer 230 by a photo-mask process, for example. Namely, the power line PL, the source electrode connection line SC, the drain electrode connection line DC, the capacitor connection line CC, the data line DL and the upper conductive layer 234 are in the same layer. Particularly, the source electrode connection line SC is connected to the power line PL, and the source electrode connection line SC is connected to the source electrode S via the sixth contact window C6. Therefore, an electrical current source is provided by the power line PL to the source electrode S via the source electrode connection line SC. Here, as an exemplary, the power line PL and the source electrode connection line SC are formed in a same photo-mask process; however the invention should not be limited to those described herein. The power line PL and the source electrode connection line SC may be fabricated by other process and in different layers.

The drain electrode connection line DC is connected to the drain electrode D via the seventh contact window C7, and the drain electrode connection line DC is further connected to the pixel electrode PE via the eighth contact window C8. The capacitor connection line CC is connected to the lower electrode 226 via the ninth contact window C9 and the tenth contact window C10. The upper conductive layer 234 is connected to the lower conductive layer 228 via the eleventh contact window C11. The upper electrode 216 is disposed on the first insulation layer 214 located above the lower electrode 226, in which the corresponding upper electrode 216 and the lower electrode 226 are formed a storage capacitor CS. The upper conductive layer 234 is disposed on the lower conductive layer 228, where the upper conductive layer 234 and the lower conductive layer 228 directly contact with each other to form a pad PD. The pad PD is, for example, located at an end of the data line DL or scan line SL as a conductive structure to electrically connect to a printed circuit board or a driving chip.

In the embodiment, the pixel electrode PE exposed by the pixel opening 232 is directly disposed on the substrate 202. In a conventional electro-luminescence device, several insulation layers are interposed between the lower electrode and the substrate. Hence, compared with the conventional electro-luminescence device, since the pixel electrode PE of the embodiment takes a role of the transparent lower electrode of the electro-luminescence device, stronger illumination intensity for display is maintained and a color shift phenomenon is rare to occur when the light emits from the pixel electrode PE toward the substrate 202. In the embodiment, four photo-mask processes are used to complete the fabrication of the pixel structure 200, such that the fabricating process is relatively simplified, thereby reducing the fabrication cost.

In the embodiment, the source electrode S, the drain electrode D, the channel layer CH, and the gate electrode G generally constitute a third active device T3. Besides, the pixel structure 200 may further include a fourth active device T4 so as to form a circuit structure having two active devices and one capacitor (i.e., 2T1C). Namely, the light-emitting layer is driven by the circuit structure having 2T1C, in which the active devices T3 and T4 are, for example, top gate electrode thin film transistors. However, the circuit structure having 2T1C is exemplified herein for illustration purposes; the invention does not pose any limitation thereto.

Figure 6:
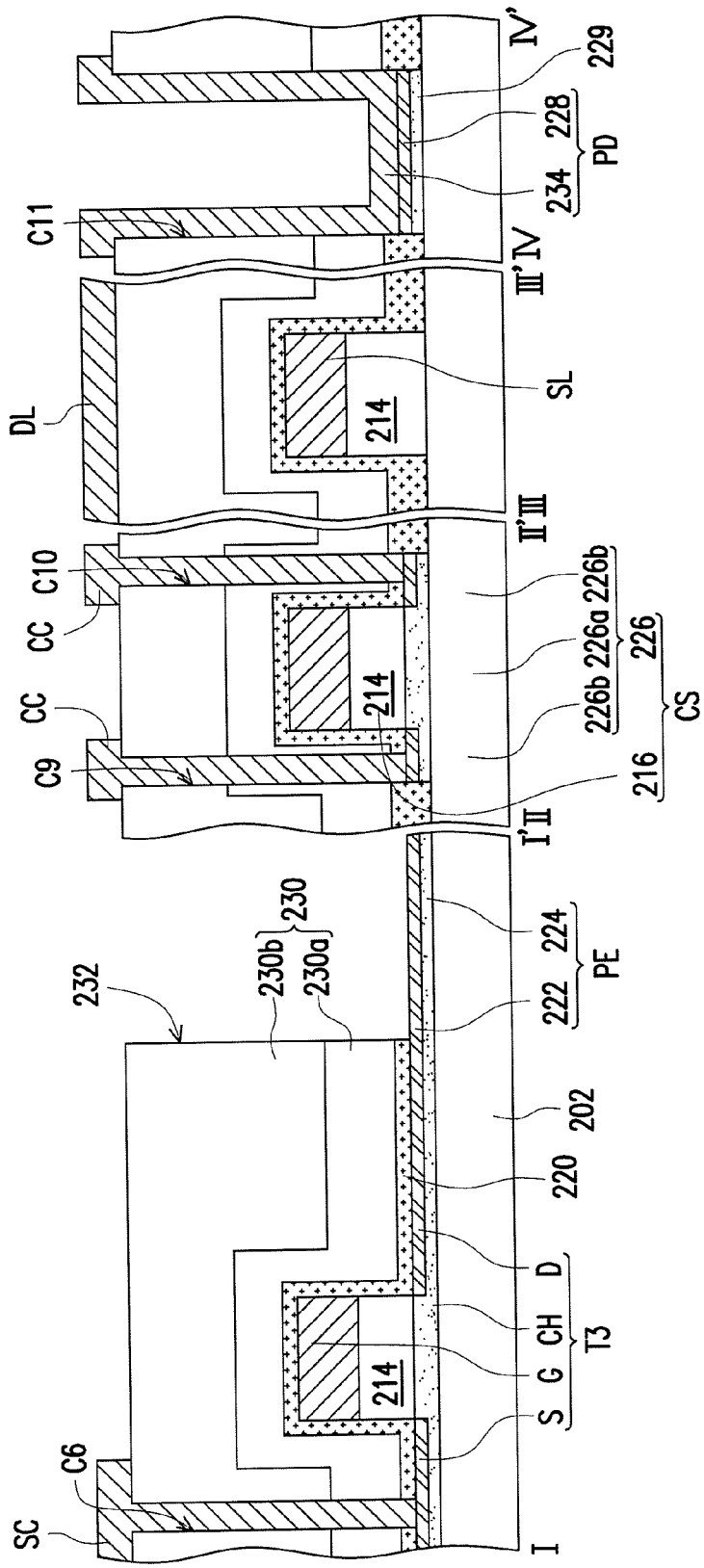
FIG. 6 is a schematic cross-sectional view of a pixel structure of another embodiment of the invention.

In the embodiment, the pixel electrode PE and the channel layer CH are separated from each other and connected to the drain electrode connection line DC. Therefore, the pixel electrode PE electrically connects to the drain electrode D via the drain electrode connection line DC, which however should not be construed as a limitation to the invention. In the embodiment of FIG. 6, the pixel electrode PE and the channel layer CH are connected to each other, thereby the pixel electrode PE is directly electrically connected to the drain electrode D.

The afore-disclosures of FIG. 2 and FIG. 5 are applied to the design of pixels of the electro-luminescence device. However, the method of modifying the pixel pattern to form the pixel electrode in the invention is not limited to only be applied to the pixel structure of the electro-luminescence device. In other words, the method of modifying the pixel pattern to form the pixel electrode in the invention can also be used in other processes requiring less photo-mask process to complete the pixel structure.

In summary, the pixel pattern and the channel layer are formed simultaneously in the invention, and the pixel pattern is modified and forms the pixel electrode having the electrical conductor properties. This way, the number of the photo-mask process can be reduced, thereby reducing the fabrication cost. Further, when the pixel electrode is used as a transparent lower electrode of the electroluminescent device, there is almost no insulation layer interposed between the pixel electrode and the substrate, thereby ensuring sufficiency of the illumination intensity for displaying and reducing the color shift.

What is claimed is:

1. A pixel structure, disposed on a substrate, comprising:
 a channel layer, disposed on the substrate;
 a source electrode and a drain electrode, disposed on the channel layer, wherein the source electrode and the drain electrode are separated from each other;
 a pixel electrode, disposed on the substrate and electrically connected to the drain electrode, wherein the channel layer and the pixel electrode comprise a semiconductor material layer, and an oxygen content of the pixel electrode is less than an oxygen content of the channel layer, and wherein the pixel electrode comprises a conductor portion and a semiconductor portion;
 a first insulation layer, covering the channel layer, wherein the first insulation layer covers the source electrode and the drain electrode and exposes at least one partial region of the pixel electrode;
 a gate electrode, disposed on the first insulation layer located above the channel layer; and
 a second insulation layer, covering the gate electrode and the first insulation layer, wherein the second insulation layer has a pixel opening, and the pixel opening exposes the at least one partial region of the pixel electrode, and exposes the conductor portion of the pixel electrode, and wherein the first insulation layer the second insulation layer cover the semiconductor portion of the pixel electrode.

2. The pixel structure as claimed in claim 1, wherein the channel layer and the pixel electrode are located on a same surface.

3. The pixel structure as claimed in claim 1, wherein the channel layer and the pixel electrode are made of the same semiconductor material layer, and a material of the semiconductor material layer comprises $In_{(2-x)}M3_{(x)}O_3[Zn_{(1-y)}M2_{(y)}O]_m N_{(z)}$, where $0 \leq x \leq 2$, $0 \leq y \leq 1$, $0 \leq m < 6$, $0 \leq z \leq 1$, and M2 and M3 each independently represents Mg, Ca, Sr, Hf, Zn, Sn, B, Al, Ga, Y, or La.

4. The pixel structure as claimed in claim 1, further comprising:
a first contact window and a second contact window, disposed in the first insulation layer, wherein the first contact window and the second contact window exposes the source electrode and the drain electrode, respectively; and
a source electrode connection line and a drain electrode connection line, disposed on the first insulation layer, wherein the source electrode connection line is connected to the source electrode via the first contact window, and the drain electrode connection lien is connected to the drain electrode via the second contact window.

5. The pixel structure as claimed in claim 1, further comprising a storage capacitor, wherein the storage capacitor comprises
a lower electrode, disposed on the substrate, wherein the first insulating layer further covers the lower electrode, and the lower electrode comprising a layer identical to the source electrode and the drain electrode; and
an upper electrode, disposed on the first insulation layer located above the lower electrode, wherein the upper electrode and the gate electrode are made of the same layer.

6. A pixel structure, disposed on a substrate, comprising:
a channel layer, disposed on the substrate;
a source electrode and a drain electrode, disposed on the channel layer, wherein the source electrode and the drain electrode are separated from each other;
a pixel electrode, disposed on the substrate and electrically connected to the drain electrode, wherein the channel layer and the pixel electrode comprise a semiconductor material layer, and an oxygen content of the pixel is less than an oxygen content of the channel layer, and wherein the pixel electrode comprises a conductor portion and a semiconductor portion, the semiconductor portion is disposed on the substrate, the conductor portion is disposed on the semiconductor portion;
a first insulation layer, covering the channel layer;
a gate electrode, disposed on the first insulation layer located above the channel layer;
a metal oxide layer, wherein the metal oxide layer covers the gate electrode, the first insulation layer, the source electrode and the drain electrode and exposes at least one partial region of the pixel electrode; and
a second insulation layer disposed on the metal oxide layer, covering the gate electrode and the first insulation layer, wherein the second insulation layer has a pixel opening, and the pixel opening exposes the at least one partial region of the pixel electrode and exposes the conductor portion of the pixel electrode.

7. The pixel structure as claimed in claim 6, further comprising:
a first contact window, a second contact window and a third contact window, disposed in the second insulation layer and the metal oxide layer, wherein the first contact window and the second contact window respectively expose the source electrode and the drain electrode, and the third contact window exposes the pixel electrode; and
a source electrode connection line and a drain electrode connection inline, disposed on the second insulation layer, wherein the source electrode connection line is connected to the source electrode via the first contact window, the drain electrode connection line is connected to the drain electrode and the pixel electrode via the second contact window and the third contact window.

8. The pixel structure as claimed in claim 6, further comprising a storage capacitor, wherein the storage capacitor comprises
a lower electrode, disposed on the substrate, wherein the lower electrode comprises an un-modified portion and two modified portions located at both sides of the un-modified portion, the modified portions, the source electrode and the drain electrode are made of the same layer, and the first insulation layer further covers the un-modified portion; and
an upper electrode, disposed on the first insulation layer located above the un-modified portion, wherein the upper electrode and the gate electrode are made of the same layer.

* * * * *